United States Patent [19]

Nakamura

[11] Patent Number: 5,439,832
[45] Date of Patent: Aug. 8, 1995

[54] METHOD FOR FABRICATING SEMICONDUCTOR DEVICE

[75] Inventor: Shunji Nakamura, Kawasaki, Japan

[73] Assignee: Fujitsu Limited, Kawasaki, Japan

[21] Appl. No.: 190,463

[22] Filed: Feb. 2, 1994

[30] Foreign Application Priority Data

Jun. 4, 1993 [JP] Japan .................................. 5-134972

[51] Int. Cl.$^6$ .......................................... H01L 21/265
[52] U.S. Cl. ....................................... 437/31; 437/33; 437/927; 437/32
[58] Field of Search .................... 437/31, 32, 195, 901, 437/921, 927, 33; 148/DIG. 159, DIG. 73, DIG. 9, DIG. 10, DIG. 11

[56] References Cited

U.S. PATENT DOCUMENTS 5,021,357 6/1991 Taguchi et al. ...................... 437/495

FOREIGN PATENT DOCUMENTS 1-137651 5/1989 Japan .

OTHER PUBLICATIONS

S. Nakamura et al., International Electron Devices Meeting pp. 445–448, 1992.

Primary Examiner—Olik Chaudhuri
Assistant Examiner—Brian K. Dutton
Attorney, Agent, or Firm—Armstrong, Westerman, Hattori, McLeland & Naughton

[57] ABSTRACT

Semiconductor-device fabricating steps include the steps of forming a first conducting film serving as an electrode on a substratum semiconductor layer through an insulating film, forming an opening in partial regions of the first conducting film and the insulating film, and thereafter forming a second conducting film for connecting the first conducting film with the substratum semiconductor layer on the inner periphery or in the vicinity of the opening, then forming a second electrode in the opening through an insulating side wall, moreover patterning the first conducting film before selectively etching and removing the insulating film under the first conducting film, and thereby forming a space between the first conducting film and the substratum semiconductor layer. Moreover, the semiconductor-device fabrication steps include the steps of patterning the first insulating film and first conducting film formed in order on the substratum semiconductor layer to from an electrode made of the first conducting film, thereafter covering the whole with a second insulating film, then patterning the second insulating film to form an opening in a region including an electrode, selectively etching and removing the first insulating film under the electrode through the opening, and thereby forming a space between the electrode and substratum semiconductor layer.

27 Claims, 18 Drawing Sheets

METHOD FOR FABRICATING SEMICONDUCTOR DEVICE

BACKGROUND OF THE INVENTION

1. Field of the Invention

The present invention relates to a method for fabricating a semiconductor device, particularly to a method for fabricating a semiconductor device comprising a device formed on a semiconductor substrate and an electrode extended from the device.

2. Description of the Related Art

As advanced information-intensive society has been developed in recent years, a computer for processing information at higher speed and communication in a short wavelength region for transferring more information are requested. To meet these requests, an LSI operating at higher speed is necessary and also a quickly-operating transistor constituting the LSI is necessary.

The inventor of the present invention et al. propose a self-aligning high-speed bipolar transistor in the following document.

[1] S. Nakamura et al., International Electron Devices Meeting pp.445–448, 1992

FIG. 1 shows a sectional view of a self-aligning bipolar transistor formed by using the prior art.

In FIG. 1, an N+-type semiconductor buried layer 101 and N--type semiconductor layer 102 are formed on a single-crystalline semiconductor substrate 100. The N--type semiconductor layer 102 and a collector contact region 103 are enclosed by a field insulating film 104. Moreover, P-type external base layer 105 and P-type internal base layer 106 which constitute a bipolar transistor are formed on the N--type semiconductor 102 and an N-type emitter layer 107 is formed above the internal base layer 106. Furthermore, a base extending electrode 108 made of a polycrystalline semiconductor containing impurities is connected to the external base layer 105. The base extending electrode 108 is extended onto a field oxide film 104 along a thin insulating film 109 formed on the surface of the N--type semiconductor layer 102.

A metallic base electrode 112 is formed on the base extending electrode 108 on the field oxide film 104 through an opening 111 formed on an interlayer insulating film 110 covering the base extending electrode 108. A side wall 113 made of an insulating material is formed on a side surface of the base extending electrode 108 closer to an emitter layer 107 and moreover, an emitter extending electrode 114 made of polycrystalline semiconductor containing impurities and a metallic emitter electrode 115 are formed on the emitter layer 107.

The N--type semiconductor layer 102 under the base layers 105 and 106 serves as a collector layer. In the collector contact region, an N+-type collector extending layer 116 is formed at a depth reaching the buried layer 101 by introducing donor to the N--type semiconductor layer 102. Moreover, a collector electrode 118 is formed on the collector extending layer 116 through an opening 117 of the interlayer insulating film 110.

The outside base layer 105 and the emitter layer 107 are formed in self-alignment due to diffusion of impurities in the extending electrodes 108 and 114 on the layers 105 and 107. The internal base layer 106 is formed in self-alignment by means of ion implantation.

Several methods for obtaining a bipolar transistor with the above structure are known. Important features of the structure are summarized into the following four points.

That is, (1) in the central base region of an active area demarcated by a thick field insulating film, (2) an insulating film, conducting film, and opening passing through the insulating film are formed on a semiconductor substrate, (3) a conductor layer or semiconductor layer for bringing the conducting film into contact with the semiconductor substrate is formed on the inner wall of the opening or at a portion adjacent to the opening, and (4) an emitter extending conducting film is formed which is insulated from the conductor layer or semiconductor layer and contacts the semiconductor substrate through the opening.

For the "conductor layer or semiconductor layer for connecting the conducting film with the semiconductor substrate" in the above point (3), the fabrication method depends on the art. However, the structure is almost the same.

To operate a bipolar transistor or MOS transistor at a high speed, it is indispensable to decrease the parasitic capacitance.

The above transistor according to the prior art can be operated at a high speed because the base layers 105 and 106 and the emitter layer 107 are finely formed in self-alignment and thereby the parasitic capacitances between the base and emitter and between the base and collector are decreased.

Moreover, to meet the request for higher speed, it is necessary not only to decrease the junction capacitance between the base and collector by decreasing the base area but to decrease the total parasitic capacitance between the base and collector by decreasing the parasitic capacitance between the N--type semiconductor layer serving as a collector layer and the base extending electrode.

The parasitic capacitance between the base and collector is determined by the interval between the base extending electrode 108 and the collector layer (102) and the permittivity of an insulating material between the electrode 108 and the collector layer (102).

However, as the interval is increased, the position of the base extending electrode 108 rises and the aspect ratio of the opening where the emitter extending electrode 114 is formed is higher. Therefore, the overall lengths of the emitter extending electrode 114 and base extending electrode 108 resultingly increase, the resistances of them increase, a parasitic resistance which is another important factor to obtain at high speed increases, and thereby a transistor operation speed is decreased.

To decrease the parasitic capacitance between the base extending electrode 108 and collector layer (102) without increasing the interval between them, it is preferable to set an insulating material with a small permittivity between them.

For example, it is considered to form a space between them in order to decrease the parasitic capacitance between electrodes as disclosed in the official gazette of Japanese Patent Laid-Open No. Hei. 1-137651.

The method for forming the space according to the official gazette comprises the steps of forming an insulating support portion 131 on a lower interconnection electrode 130 as shown in FIG. 2A and then filling a portion serving as a space with SOG (spin on glass) 132 as shown in FIG. 2B, and thereafter forming an upper interconnection electrode 133 as shown in FIG. 2C and moreover removing the SOG 132 from the space by means of wet etching as shown in FIG. 2D. In FIG. 2, symbol 134 represents a substratum insulating film.

However, unlike the above interconnection electrode, the extending electrode of the bipolar transistor having the structure shown in FIG. 1 constitutes a part of the transistor and moreover the transistor has a very small area. Therefore, because only the art disclosed in the above official gazette is insufficient and a method for fabricating a semiconductor device suited to fabricate a self-aligning transistor is necessary.

The self-aligning transistor includes a MOS transistor and a static induction transistor in addition to the bipolar transistor.

SUMMARY OF THE INVENTION

It is an object of the present invention to provide a method for fabricating a semiconductor device for decreasing the parasitic capacitance of a semiconductor device.

The present invention provides a method for fabricating a semiconductor device, comprising the steps of forming a conducting film on a first insulating film, patterning at least the conducting film, forming a second insulating film for supporting the conducting film on a substratum semiconductor layer, and selectively removing the first insulating film to form a space under the conducting film. For this method, a space is formed under an electrode constituting a part of a semiconductor device and the parasitic capacitance is decreased. The second insulating film use an insulating film for covering a part or the whole of the electrode of the semiconductor device, therefore, the present invention is the most suitable to fabricate a semiconductor device.

For the another present invention, a space is formed between a first conducting film and a substratum semiconductor layer, by method comprising the step of by forming the first conducting film serving as an electrode on a substratum semiconductor layer through an insulating film, forming an opening passing through the first conducting film and the insulating film, forming a second conducting film for bringing the first conducting film into contact electorically with the substratum semiconductor layer in the inner periphery or in the vicinity of the opening, forming a second electrode in the opening through an insulating side wall, and pattering the first conducting film before selectively etching and removing the insulating film present under the first conducting film. This space forming method is the most suitable to fabricate a self-aligning transistor having an opening in an electrode because a space is formed under a first conducting film while securely supporting the conducting film with a plurality of films formed in the opening of the first conducting film.

For further invention, a space is formed between an electrode and a substratum semiconductor layer, by method comprising the step of pattering a first insulating film and first conducting film formed in order on a substratum semiconductor layer to form an electrode made of the first conducting film, covering the whole with a second insulating film, patterning the second insulating film to form an opening in a region including the electrode, and removing the first insulating film under the electrode by means of selective etching through the opening.

This space forming method is the most suitable to fabricate a self-aligning transistor because a space is formed under an electrode while supporting the electrode with a second insulating film and therefore, this state is kept in the subsequent processes to follow the step of forming an opening in the steps of fabricating a self-aligning transistor.

As described above, when a space is formed between an electrode constituting a self-aligning transistor and a substratum semiconductor layer under the electrode, the parasitic capacitance between the substratum semiconductor layer and electrode is decreased to approx. ⅓ because the permittivity can be decreased compared with a structure in which the space is filled with an insulating material.

DESCRIPTION OF THE PREFERRED EMBODIMENTS (First Embodiment)

FIGS. 3A to 3K are sectional views showing the steps for the first embodiment of the present invention, more concretely, the steps of fabricating a bipolar transistor.

Figure 1:
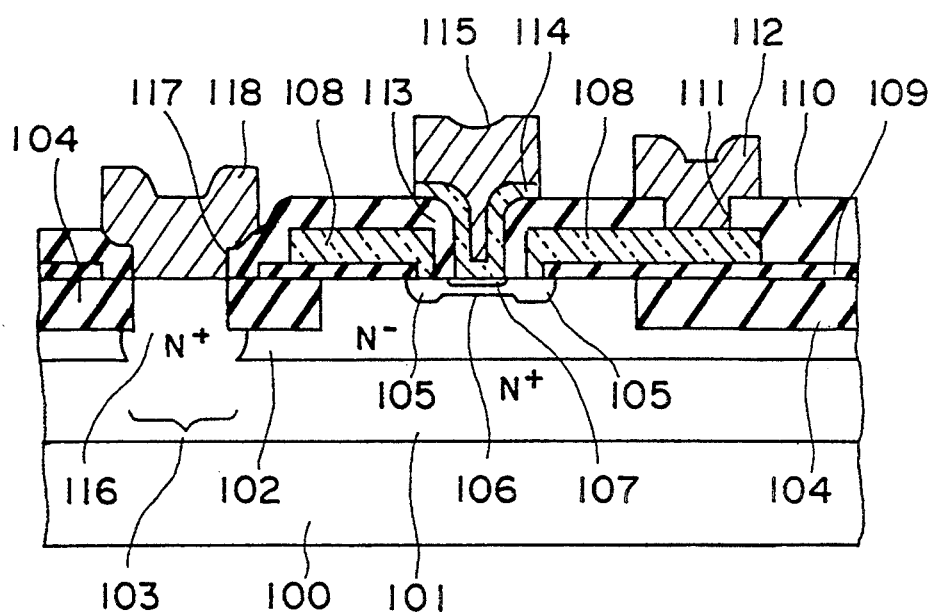
FIG. 1 is a sectional view showing an existing semiconductor device of the prior art.
Figure 2A:
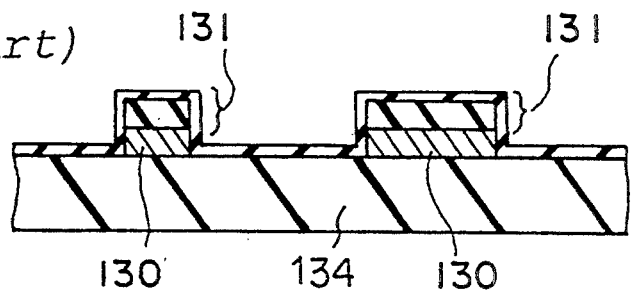
FIGS. 2A to 2D are sectional views showing an interconnection step for a semiconductor device of the prior art.
Figure 2B:
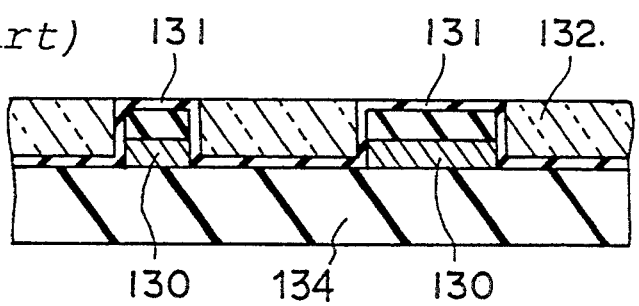
Figure 2C:
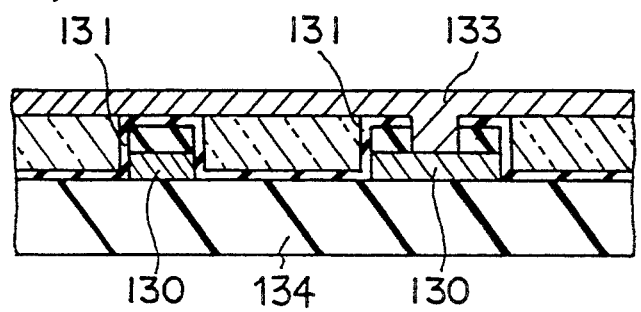
Figure 2D:
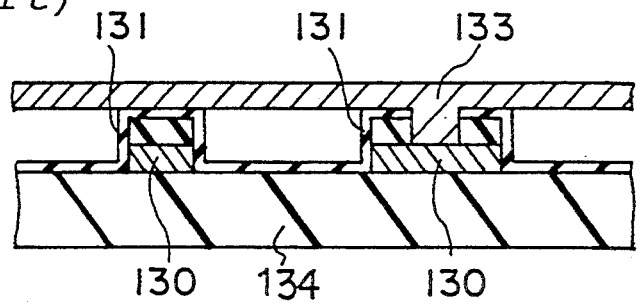
Figure 3A:
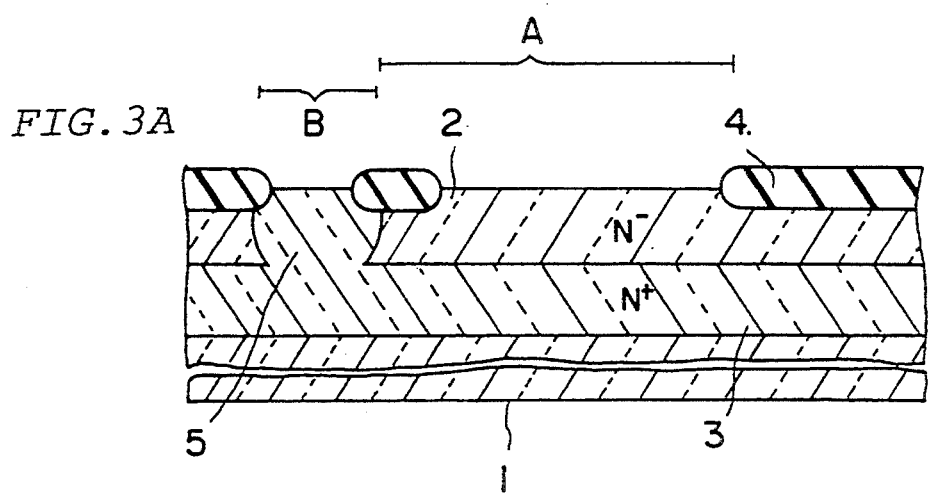
FIGS. 3A to 3K are sectional views showing the steps of fabricating a bipolar transistor which is the first embodiment of the present invention.

As shown in FIG. 3A, an $N^-$-type semiconductor layer 2 made of silicon is epitaxial-deposited on a semiconductor substrate 1 made of P-type silicon up to a thickness of approx. 1 μm and an $N^+$-type buried layer 3 is formed between the $N^-$-type semiconductor layer 2 and semiconductor substrate 1.

A field oxide film 4 with the thickness of 6,000 Å is formed by means of the local oxidation of silicon around a base forming region A and a collector contact region B of the $N^-$-type semiconductor layer 2. In the collector contact region, an $N^+$-type collector contact layer 5 passing through the $N^-$-type semiconductor layer 2 is formed at a depth reaching the buried layer 3 by diffusing N-type impurities such as phosphorus and arsenic.

Figure 3B:
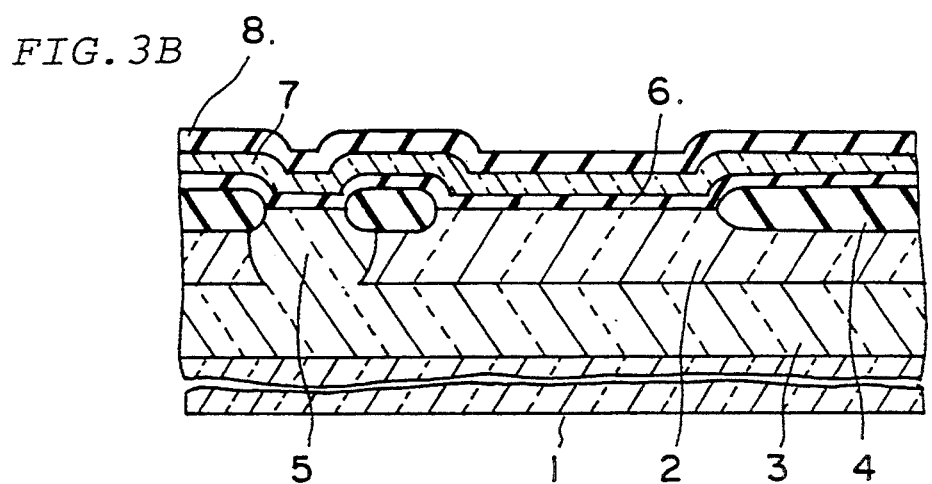

As shown in FIG. 3B, an Si$_3$N$_4$ film 6, and polycrystalline silicon film 7, SiO$_2$ film 8 are deposited in order up to thicknesses of 2,000, 3,000, and 5,000 Å respectively by means of CVD.

Moreover, boron is implanted into the polycrystalline silicon film 7 at the concentration of approx. 1×10$^{21}$/cm$^3$ by means of ion implantation.

Figure 3C:
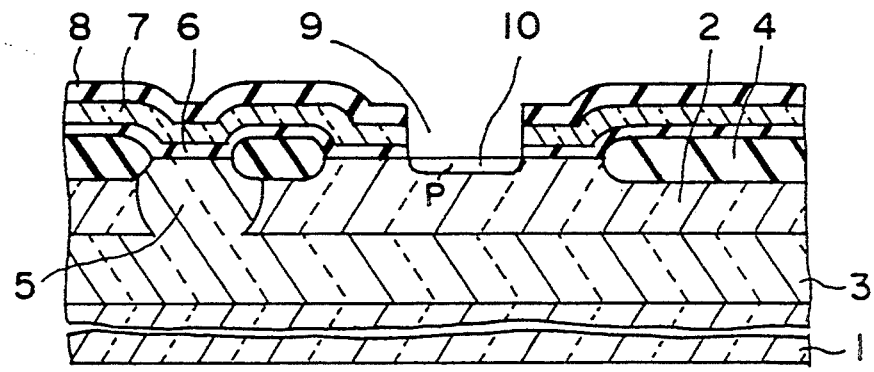

Then, films from an SiO$_2$ film 8 to Si$_3$N$_4$ film 6 in the base forming region are etched by means of lithography to form an opening 9 for locally exposing the N$^-$-type semiconductor layer 2 as shown in FIG. 3C. Then, boron ions are implanted into the N$^-$-type semiconductor layer 2 through the opening 9 to form a base layer 10 by activating the ions.

Figure 3D:
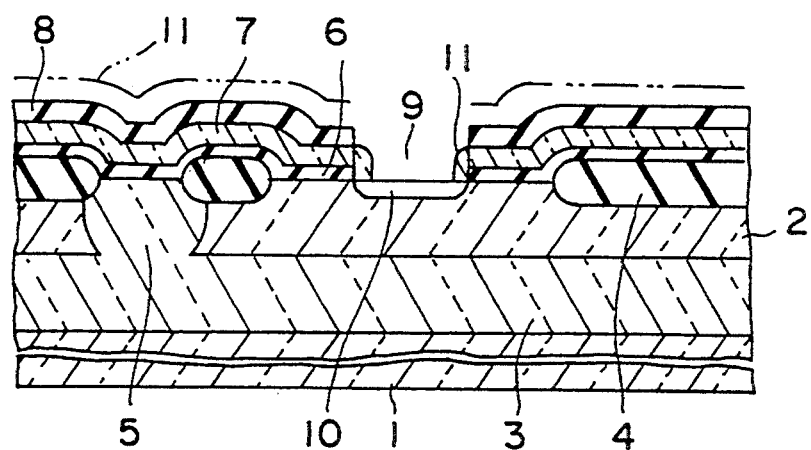

Thereafter, a second polycrystalline silicon film 11 is entirely deposited by means of CVD up to the thickness of 1,000 Å. Then, not-illustrated resist is entirely applied and the resist and the polycrystalline silicon film 11 are anisotropic-etched approximately vertically so that they are left only in the opening 9. Then, the resist is removed to further anisotropic-etch the polycrystalline silicon film 11 so that the film 11 is left on the side wall of the opening 9 at a position lower than the top of the insulating film 8 and a hole for exposing the surface of the base layer 10 is formed at the center of the opening 9 as shown in FIG. 3D.

Figure 3E:
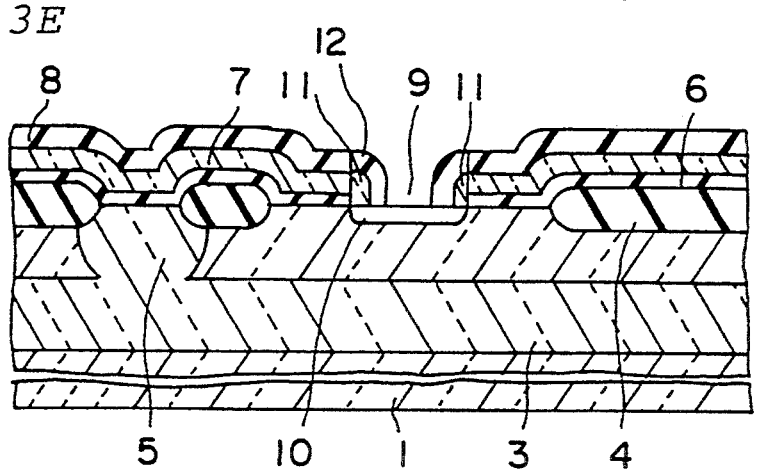

Moreover, an insulating side wall 12 for covering the polycrystalline silicon film 11 on the side wall of the opening 9 is formed as shown in FIG. 3E by entirely forming an SiO$_2$ film and then anisotropic-etching the film. In this case, the SiO$_2$ film is etched so that the opening 9 is not entirely covered with the side wall 12 but the central portion of the surface of the base layer 10 is exposed.

Thereafter, a third polycrystalline silicon film 13 containing N-type impurities such as phosphorus and arsenic is formed.

Figure 3F:
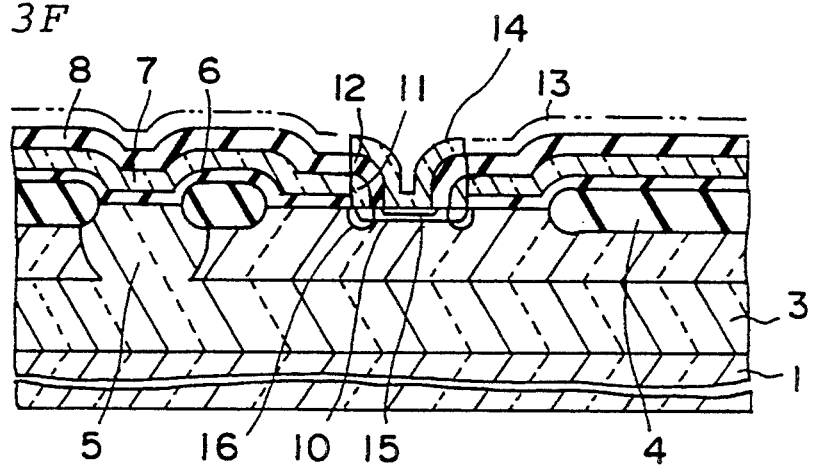

Then, a resist pattern (not illustrated) for covering the opening 9 and its periphery is formed and the third polycrystalline silicon film 13 is patterned by using the resist pattern so that the film 13 is left in the opening 9 and its periphery as shown in FIG. 3F. The patterned third polycrystalline silicon film 13 serves as an emitter extending electrode 14.

Thereafter, annealing is performed at the heating temperature of 900° C. for the heating time of 60 min to diffuse N-type impurities in the third polycrystalline silicon film 13 onto the base layer 10 and form an emitter layer 15. At the same time, P-type impurities in the first polycrystalline silicon film 7 are diffused onto the N$^-$-type semiconductor layer 2 through the polycrystalline silicon film 11 on the side wall of the opening 9 to form a P$^+$-type external base layer 16.

Figure 3G:
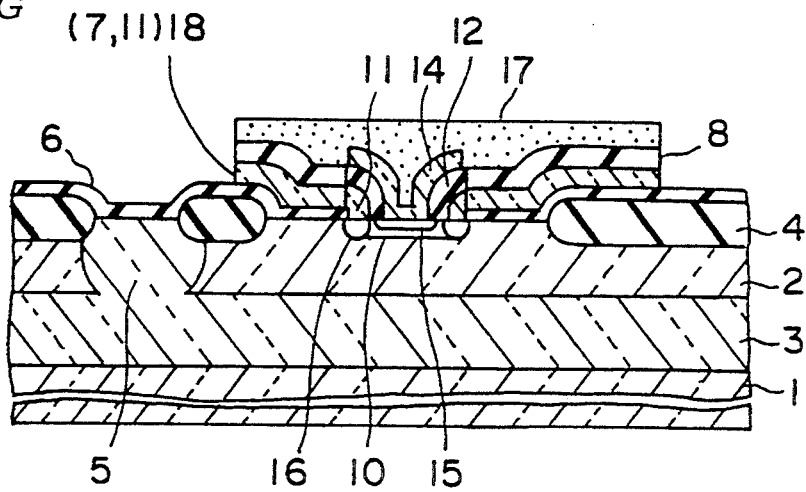

Then, as shown in FIG. 3G, a region extending from the base layer 10 onto the field oxide film 4 around the layer 10 is covered with the resist pattern 17 and then the SiO$_2$ film 8 uncovered with the resist pattern 17 and the first polycrystalline silicon film 7 are etched in order. The polycrystalline silicon films 10 and 11 left under the resist pattern 17 serve as a base extending electrode 18.

Figure 3H:
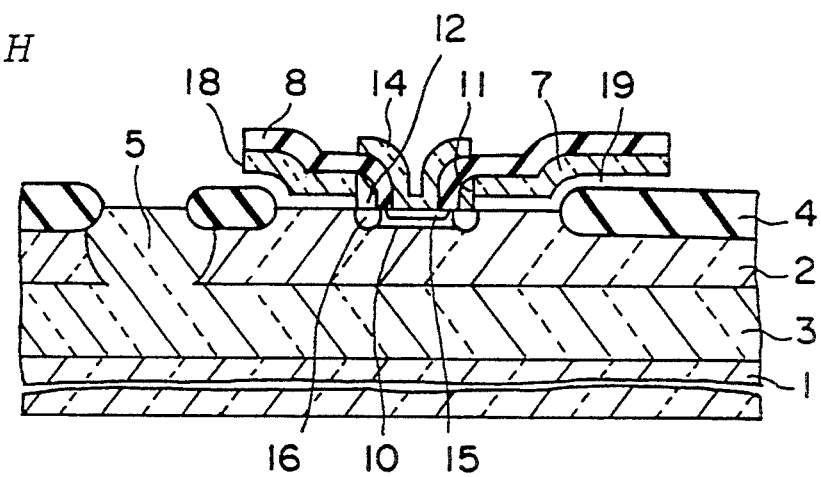

Thereafter, as shown in FIG. 3H, the Si$_3$N$_4$ film 6 on both the N$^-$-type semiconductor layer 2 and the field oxide film 4 is removed by means of phosphoric acid boiling.

In this case, because the base extending electrode 18 and the SiO$_2$ film 8 are supported by the polycrystalline silicon film 11, insulating side wall 12, and emitter electrode 14 the polycrystalline silicon film 7 constituting the base extending electrode 18 is not bent and a space 19 is formed between the film 7 and the semiconductor layer 2 under the film 7.

Figure 3I:
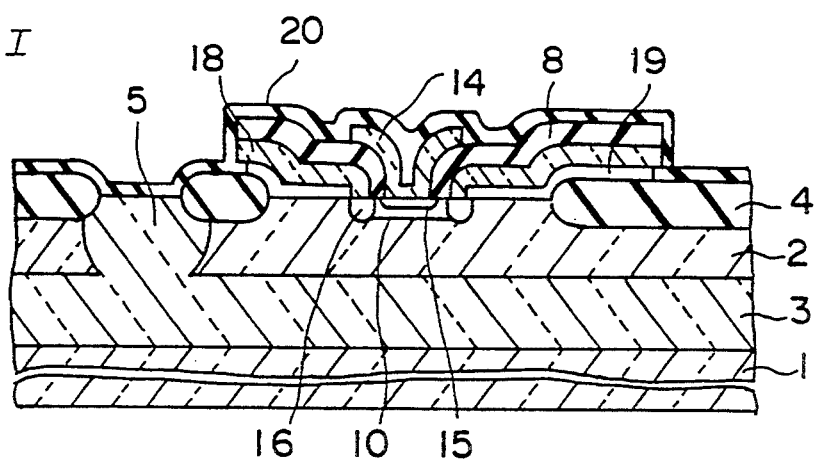

Then, as shown in FIG. 3I, an SiO$_2$ film 20 is chemical-vapor-deposited up to the thickness of 3,000 Å by means of plasma CVD.

In this case, the gas pressure and temperature for depositing the film are set to values so that SiO$_2$ is approximately vertically deposited and the film is hardly deposited in the space. Under this condition, the outer periphery of the base extending electrode 18 is supported by the SiO$_2$ film 20. Therefore, in the subsequent step, the base extending electrode 18 does not bend or the space 19 between the electrode 18 and the N$^-$-type semiconductor layer 2 does not disappear.

As described above, because the base extending electrode 18 bends at its central region and only connects with the base layer 10 and portions other than the electrode 18 completely float from the semiconductor layer 2, the permittivity decreases to approx. ⅓ compared with that of an existing one in which the space is filled with SiO$_2$ and the parasitic capacitance between the base and collector decreases.

Moreover, because the polycrystalline silicon film 7 is supported by the emitter extending electrode 14 and SiO$_2$ film 12 in the opening 9 to form the space 19 under the polycrystalline silicon film 7 serving as the base extending electrode 14, it is unnecessary to set an insulating support portion for supporting an upper electrode described in the prior art under a part of the base extending electrode 14 and thereby a margin for patterning the insulating support portion is unnecessary.

Figure 3J:
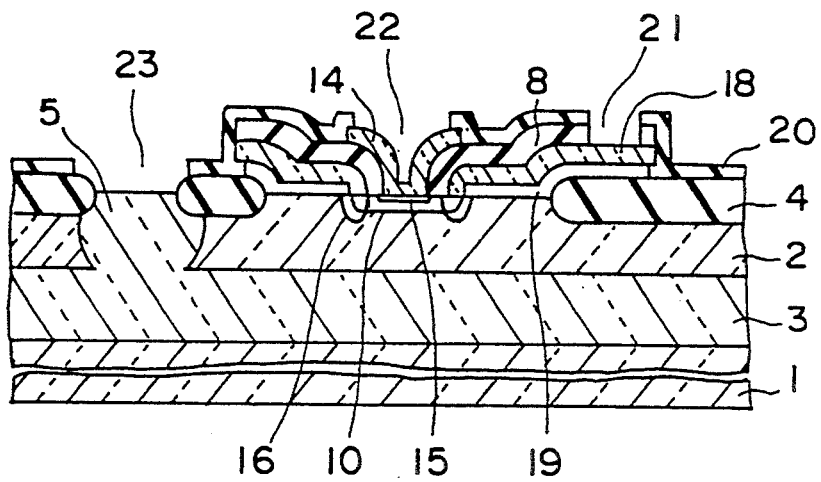

Then, as shown in FIG. 3J, the SiO$_2$ film 20 covering the base extending electrode 18 and emitter extending electrode 14 is patterned to form via holes 21 and 22 on the base extending electrode 18 and emitter extending electrode 14 respectively and an opening 23 on the collector contact layer 5.

Figure 3K:
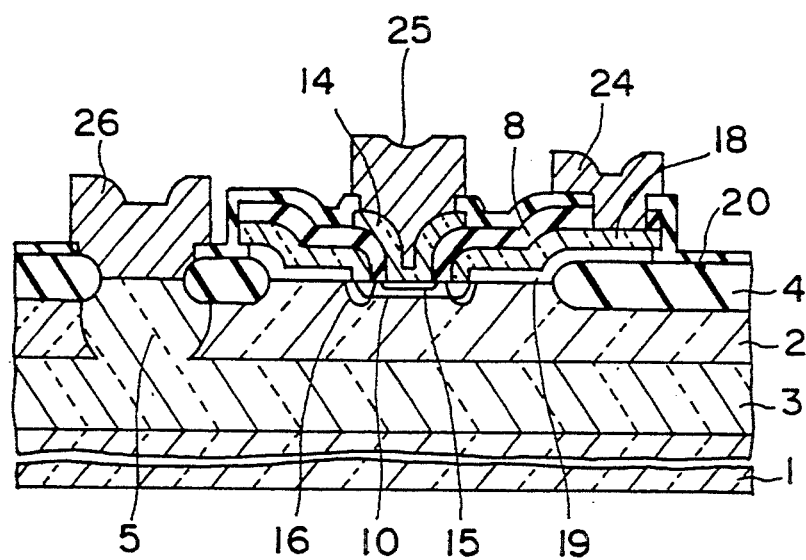

Then, as shown in FIG. 3K, an aluminum film is entirely formed by means of sputtering and thereafter the aluminum film is patterned by means of lithography to form a base electrode 24 connected to the base extending electrode 18, an emitter electrode 25 connected to the emitter extending electrode 14, and a collector electrode 26 connected to the collector contact layer 5. Thus, a bipolar transistor is completed.

It is a matter of course that a conducting film is formed by implanting impurities into semiconductor such as silicon.

(Second Embodiment)

For the above embodiment, an Si$_3$N$_4$ film under a base extending electrode is removed and thereafter an SiO$_2$ film for supporting the periphery of the base extending electrode is formed.

However, the supporting method is not restricted to the above one. An example of the supporting method is described below.

Figure 4A:
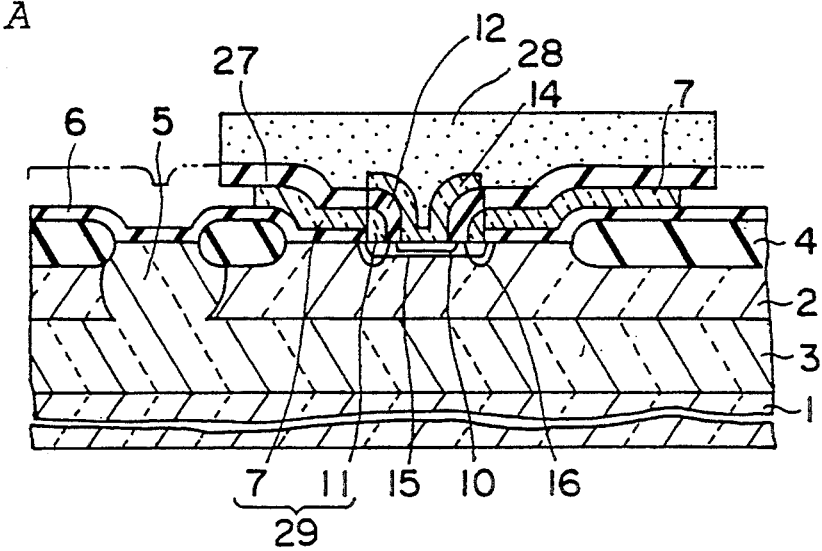
FIGS. 4A to 4C are sectional views showing the steps of fabricating a bipolar transistor which is the second embodiment of the present invention.
Figure 4B:
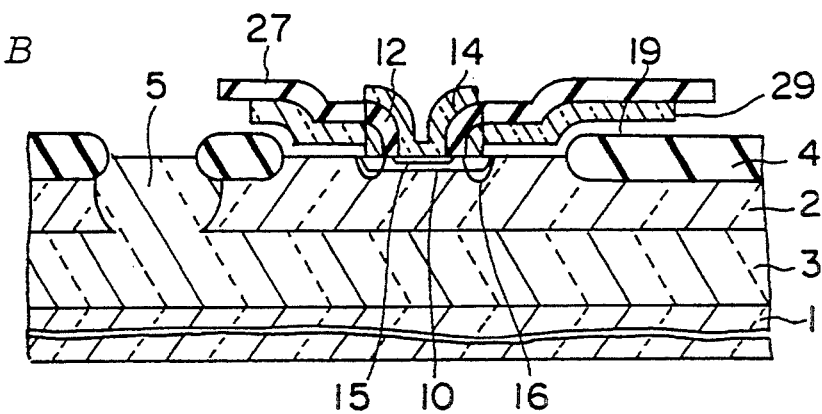
Figure 4C:
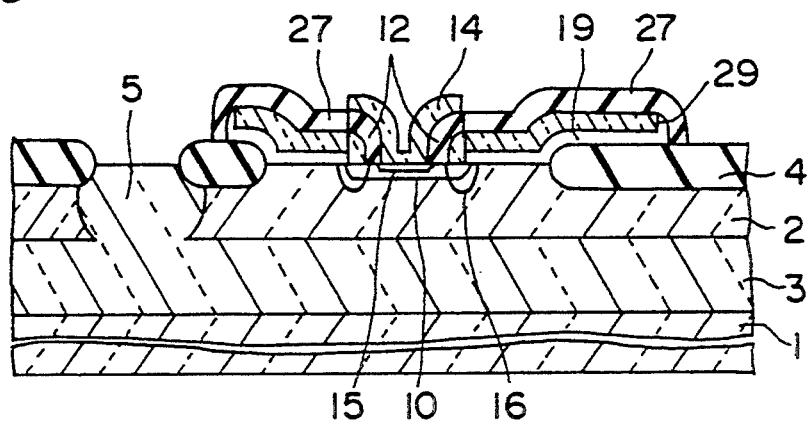

FIGS. 4A to 4C are sectional views showing the steps for the second embodiment of the present invention, in which a symbol same as that in the first embodiment shows the same element.

For this embodiment, the steps until the emitter electrode 14 is formed on the semiconductor substrate 1 are the same as those for the first embodiment. Therefore, description starts with a process after the emitter electrode 14 is formed as shown in FIG. 3F. However, an insulating film for covering the polycrystalline silicon film 7 constituting the base extending electrode 18 uses a PSG film 27 instead of the SiO$_2$ film 8.

The following is the description of the steps until the state shown in FIG. 4A is obtained.

First, a resist pattern 28 for covering a region protruding by approx. 5,000 Å from a region for forming a base extending electrode is formed by applying, exposing, and developing resist.

Then, the PSG film 27 and the polycrystalline silicon film 7 under the film 27 are patterned and a hood is formed by side-etching the polycrystalline silicon film 7 up to the length of 5,000 Å in the lateral direction from the side of the film 7 by using a mixed solution of HF and HNO$_3$. Thereby, the remaining polycrystalline silicon film 7 and the polycrystalline silicon film 11 in the opening 9 are used as a base extending electrode 29.

Then, the resist pattern 28 is removed and thereafter, as shown in FIG. 4B, the Si$_3$N$_4$ film 6 is selectively removed by means of phosphoric acid boiling. Under this state, similarly to case of the first embodiment, the base extending electrode 29 is supported by the central emitter extending electrode 14, polycrystalline silicon film 11 around the electrode 14, and SiO$_2$ film 12 and a space is formed between the base extending electrode 29 and semiconductor layer 2. In the space, there is no portion which is partially supported through an insulating material.

Thereafter, by melting the PSG film 27 by means of thermal treatment at 900° C., the periphery expanded like a hood bends downward and contacts the field insulating film 4 as shown in FIG. 4C. Thereby, the periphery of the base extending electrode 29 is supported by a bent portion of the PSG film 27 on the field oxide film 4.

When forming an SiO$_2$ film, this support method makes it possible to keep a space between a base extending electrode and semiconductor layer without setting a film forming condition to a bad condition that a film is hardly deposited further inside the space like the case of the first embodiment.

In the subsequent steps, an opening and via hole are formed on the SiO$_2$ film and then a base electrode, emitter electrode, and collector electrode made of aluminum are formed on it. However, the description of the method is omitted because it is the same as that for the first embodiment.

The PSG film can use any other materials with a low melting point such as BPSG and BSG.

(Third Embodiment)

FIGS. 5A to 5F are sectional views showing the steps for the third embodiment of the present invention, in which the steps of forming a bipolar transistor are shown.

Also for this embodiment, an N$^+$-type buried layer 3 and N$^-$-type semiconductor layer 2 are formed on a P-type semiconductor substrate 1 and a field oxide film 4 is formed on the surface of the N$^-$-type semiconductor layer around a active area and collector contact region, similarly to the first embodiment. Moreover, an N$^+$-type collector contact layer 5 is formed in the collector contact region of the N$^-$-type semiconductor layer 2 by diffusing impurities.

Figure 5A:
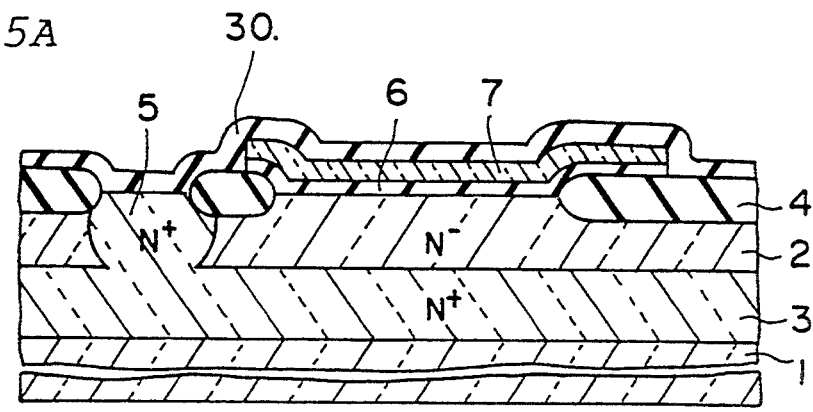
FIGS. 5A to 5F are sectional views showing the steps of fabricating a bipolar transistor which is the third embodiment of the present invention.

Under the above state, an Si$_3$N$_4$ film 6 and a polycrystalline silicon film 7 containing boron are entirely deposited in order up to thicknesses of 1,000 Å and 3,000 Å respectively by means of CVD and thereafter these films 6 and 7 are patterned by means of lithography as shown in FIG. 5A so that the films 6 and 7 remain in a range reaching a base forming region and the field oxide film 4 around the region. Then, an SiO$_2$ film 30 is entirely deposited.

Figure 5B:
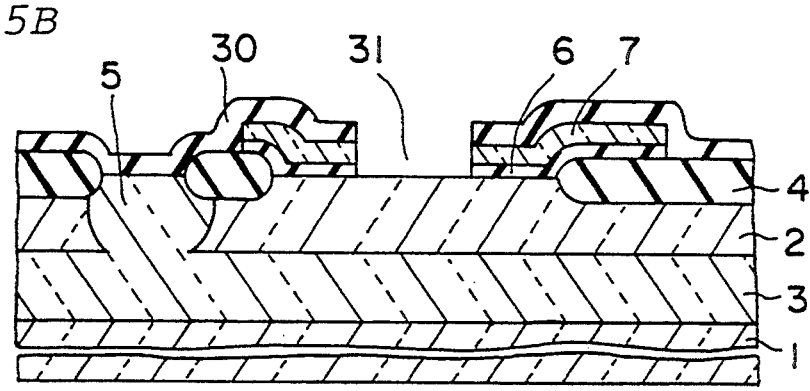

Then, the Si$_3$N$_4$ film 6, polycrystalline silicon film 7, and SiO$_2$ film 30 are patterned by means of lithography to form an opening 31 on the base forming region as shown in FIG. 5B.

Figure 5C:
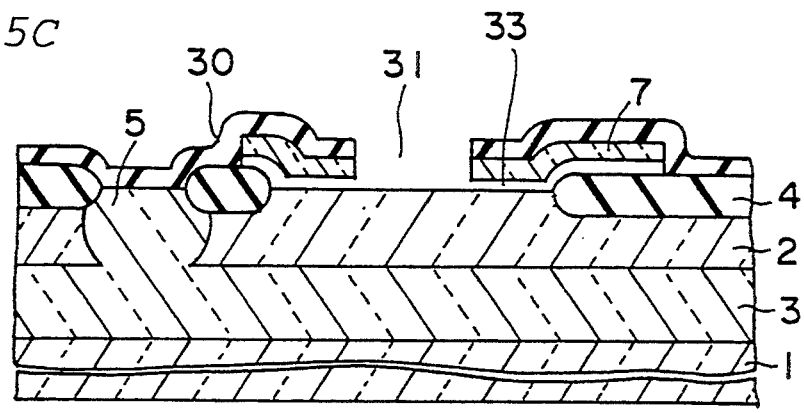

Then, by removing the Si$_3$N$_4$ film 6 through the opening 31 by means of phosphoric acid boiling, the polycrystalline silicon film 7 on the Si$_3$N$_4$ film 6 does not drop to the semiconductor layer 2 side because it is supported by the SiO$_2$ film 30 on the film 7 and a space 33 is formed between the polycrystalline silicon film 7 and semiconductor layer 2 as shown in FIG. 5C.

When selectively epitaxial-growing silicon by means of chemical vapor deposition by using, for example, Si$_2$H$_6$ Gas, a single-crystalline silicon layer 34 Grows on the N$^-$-type semiconductor layer 2 exposed from the opening 31, polycrystalline silicon 35 grows from the bottom of the polycrystalline silicon layer 7 close to the opening 31, and the polycrystalline silicon 35 and single-crystalline layer 34 connect each other from the top and bottom. In this case, no silicon Grows on an insulating film.

Figure 5D:
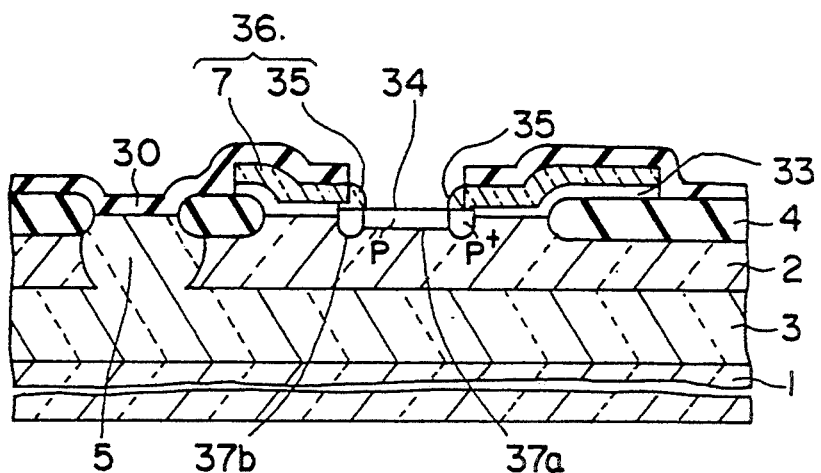

As a result, the height of the semiconductor layer 2 at a portion exposed from the opening 31 increases while the periphery of the polycrystalline silicon film 7 close to the opening 31 grows downward and sideward and the thickness increases. Thus, as shown in FIG. 5D, the film 7 is connected to the semiconductor layer 2 to form a base extending electrode 36 as shown in FIG. 5D.

Thereafter, a P-type internal base layer 37$a$ is formed under the opening 31 by implanting boron ions onto the surface of the semiconductor layer 34 exposed from the opening 31 and activating the impurities by means of annealing and a P$^+$-type external base layer 37$b$ is formed by diffusing impurities present in the polycrystalline silicon film 7 constituting the base extending electrode 36 into the semiconductor layer 2.

Figure 5E:
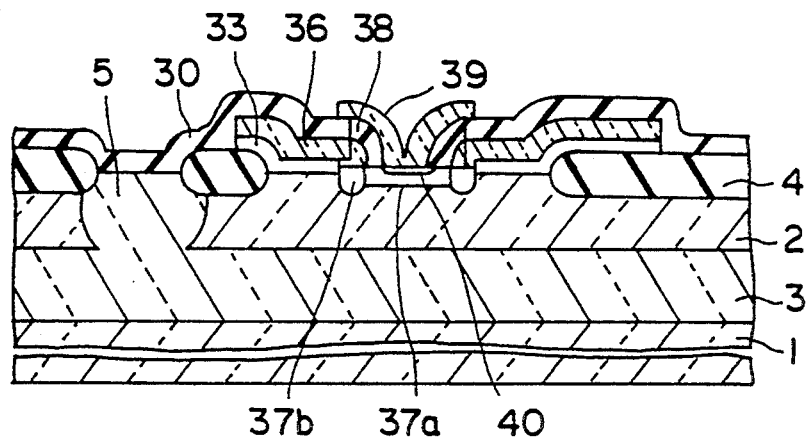

Then, by entirely forming and anisotropic-etching an SiO$_2$ film, an insulating side wall 38 for covering the polycrystalline silicon 35 is formed in the inner periphery of the opening 31 as shown in FIG. 5E. Thereafter, an emitter extending electrode 38 is formed by the same method as the first embodiment and impurities in the electrode 39 are diffused into the upper portion of the internal base layer 37$a$ to form an emitter layer 40.

Figure 5F:
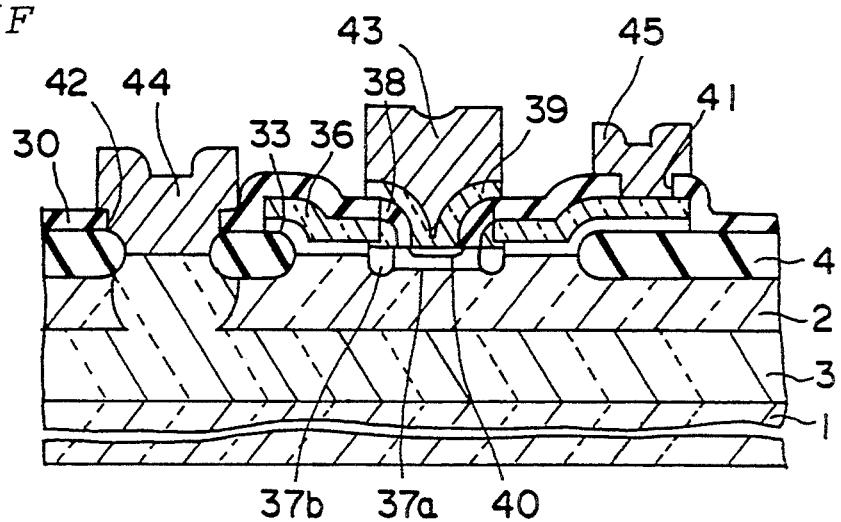

Then, as shown in FIG. 5F, the top SiO$_2$ film 30 is patterned to form openings 41 and 42 on the base extending electrode 36 and collector contact layer 5. Then, an emitter electrode 43, collector electrode 44, and base electrode 45 are formed by forming and patterning an aluminum film.

The base extending electrode 36 formed by the above method has a space 33 between the electrode 36 and the semiconductor layer 2 under the electrode 36, similarly to the first embodiment.

Therefore, the permittivity between them decreases and the base-collector parasitic capacitance decreases. Moreover, because the top surfaces of the base layers 37$a$ and 37$b$ are selectively raised due to epitaxial growth, the joint between the base extending electrode 36 and external base layer 37$b$ shortens and the resistance of the base extending electrode 36 decreases without narrowing the space 33.

(Fourth Embodiment)

Figure 6A:
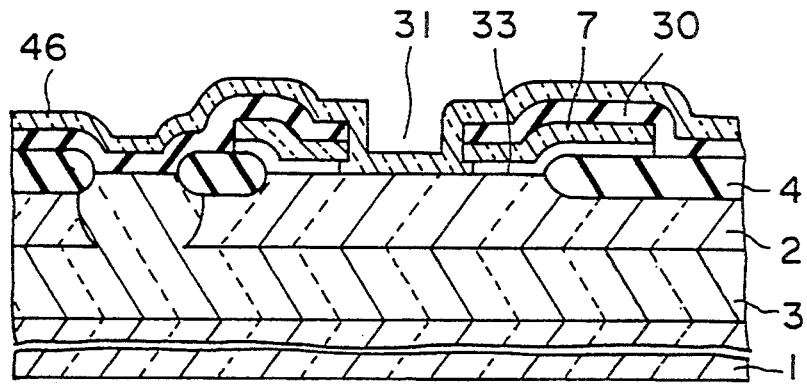
FIGS. 6A to 6C are sectional views showing the steps of fabricating a bipolar transistor which is the fourth embodiment of the present invention.
Figure 6B:
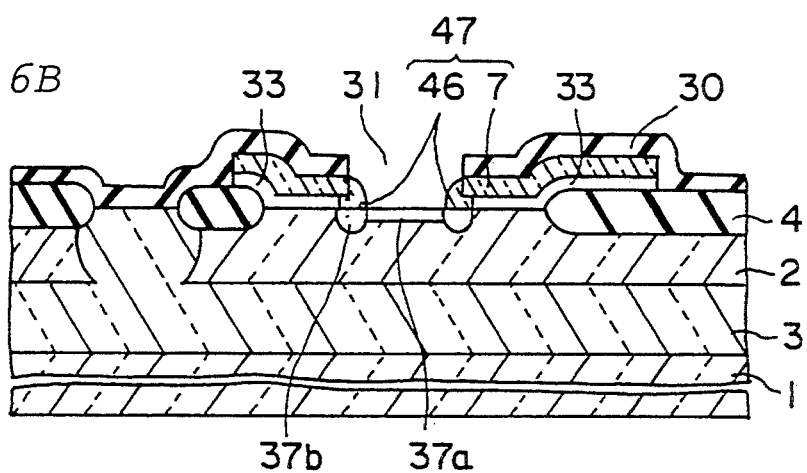
Figure 6C:
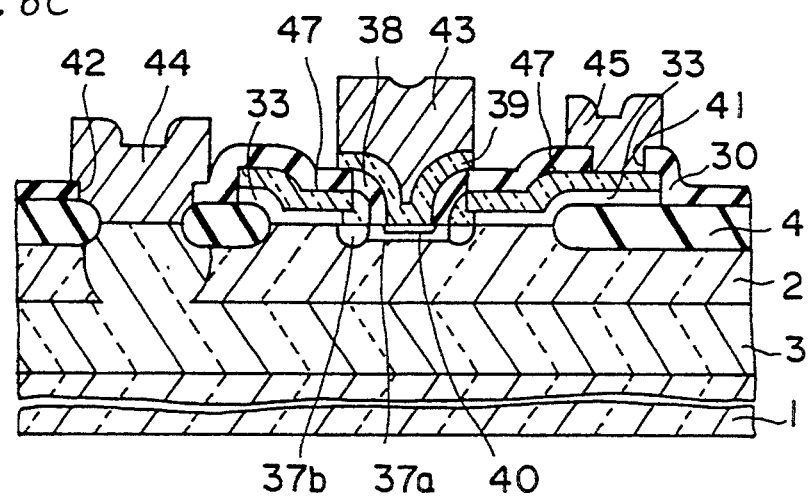

FIGS. 6A to 6C are sectional views showing the steps for the fourth embodiment of the present invention. A symbol same as that of the third embodiment shows the same element and the steps until the $Si_3N_4$ film 6 on the $N^-$-type semiconductor layer 2 is removed are the same as those for the third embodiment.

After the $Si_3N_4$ film 6 is removed, a second polycrystalline silicon film 46 is entirely chemical-vapor-deposited under a bad condition that the film is hardly deposited further inside a space.

Thus, silicon grows only around the opening 31 of the polycrystalline silicon film 7 serving as a base extending electrode and the space 33 is kept formed between the polycrystalline silicon film 7 and semiconductor layer 2.

Then, after not-illustrated resist is applied, the resist and the polycrystalline silicon film 46 under the resist are anisotropic-etched in the vertical direction to leave them only in the opening 31. Then, after the resist in the opening 31 is removed, the polycrystalline silicon film 46 in the opening 31 is anisotropic-etched to leave it only at a position lower than the top end of the insulating film 30 on the inner wall of the opening 31 as shown in FIG. 6B and form a base extending electrode 47 with the polycrystalline silicon film 46 and polycrystalline silicon film 7 connected to the film 46.

Thereafter, an internal base layer 37a and external base layer 37b are formed under the opening 31 by the same method as the third embodiment.

Then, an insulating side wall 38 and an emitter extending electrode 39 made of polycrystalline silicon containing impurities shown in FIG. 6C are formed by the method described in the third embodiment and moreover, an emitter layer 40 is formed on the upper portion of the inner base layer 37a by means of solid-phase diffusion of the impurities. Then, an emitter electrode 43 is formed on the emitter extending electrode 39, a collector electrode 44 is formed on the collector contact layer 5, and a base electrode 45 is formed on the base extending electrode 47.

Also for this embodiment, the opening 31 is formed and thereafter the $Si_3N_4$ film beneath the polycrystalline silicon film 7 serving as the base extending electrode 47 is removed to form the space 33 between the polycrystalline silicon film 7 and semiconductor layer 2, similarly to the second embodiment.

Thereby, because the polycrystalline silicon film 7 is supported by the $SiO_2$ film 30 and further supported by the polycrystalline silicon film 46 on the inner wall of the opening 31 and the insulating side wall 39, the space 33 under the polycrystalline silicon film 7 constituting the base extending electrode 47 is maintained as it is and the base-collector parasitic capacitance decreases.

(Fifth Embodiment)

Figure 7A:
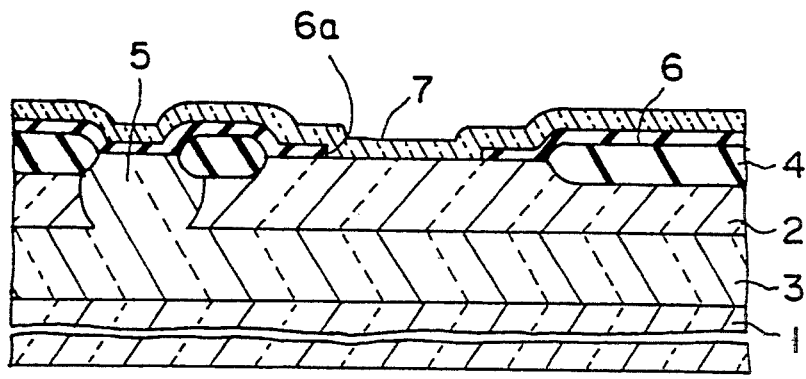
FIGS. 7A to 7F are sectional views showing the steps of fabricating a bipolar transistor which is the fifth embodiment of the present invention.
Figure 7B:
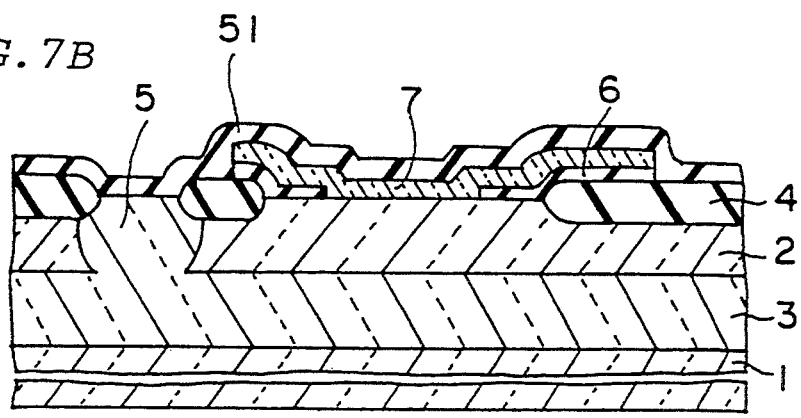
Figure 7C:
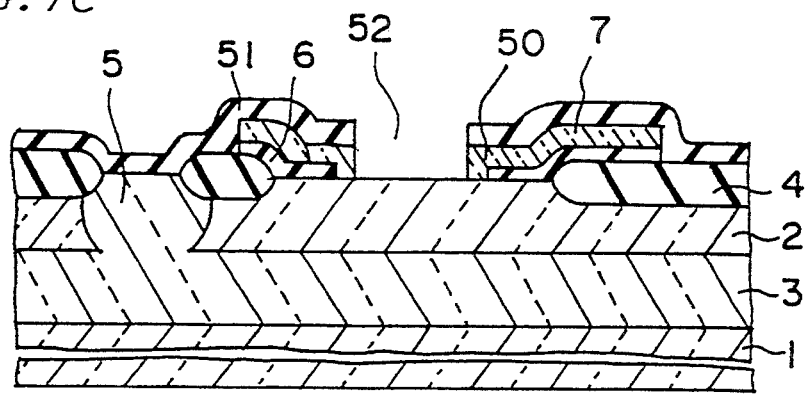
Figure 7D:
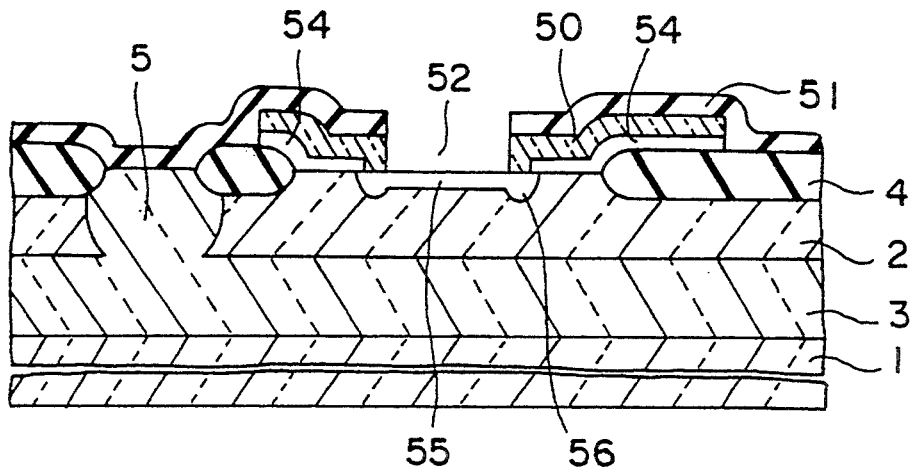
Figure 7E:
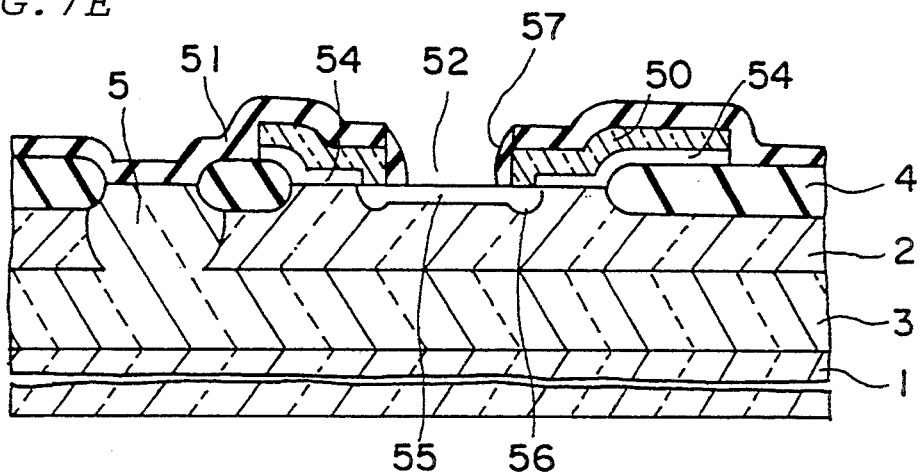
Figure 7F:
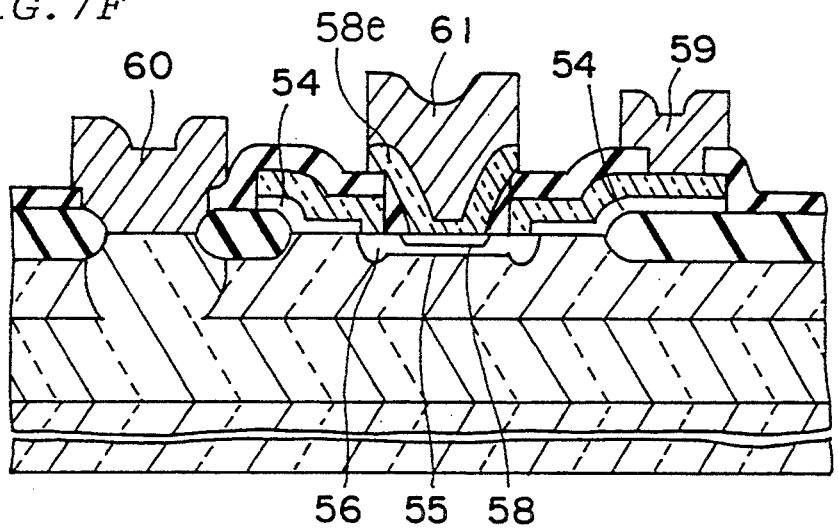
Figure 8:
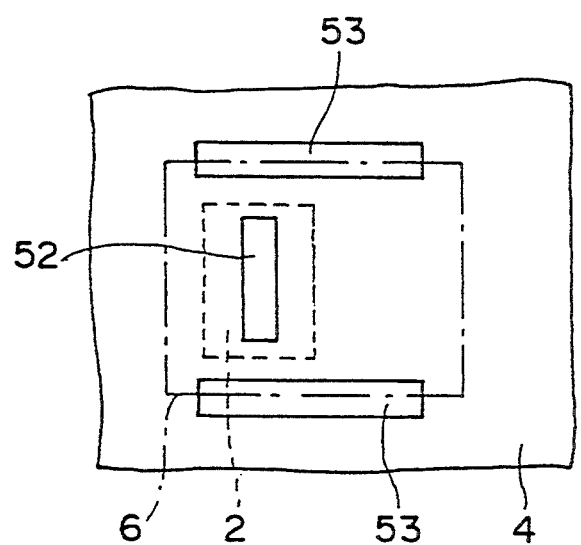
FIG. 8 is a top view of the fifth embodiment of the present invention in a step.

FIGS. 7A to 7F are sectional views showing the fabrication steps for the fifth embodiment of the present invention and FIG. 8 is a top view of one of the steps, in which a symbol same as that in the fourth embodiment shows the same element.

In FIG. 7A, it is the same as the above embodiment that an $N^+$-type buried layer 3, $N^-$-type semiconductor layer 2, field oxide film 4, and collector contact layer 5 are formed in predetermined regions on a semiconductor substrate 1.

Under the above state, an $Si_3N_4$ film 6 is entirely formed and thereafter the $Si_3N_4$ film 6 in a base forming region is removed to form an opening 6a. Then, by depositing a polycrystalline silicon film 7 containing P-type impurities, the semiconductor layer 2 connects with the polycrystalline silicon film 7 in the base forming region.

Then, the $Si_3N_4$ film and polycrystalline silicon film 7 are patterned to leave them in a range from the base forming region to the field oxide film 4 around the region.

Then, as shown in FIG. 7B, an $SiO_2$ film 51 is deposited up to the thickness of 5,000 Å by means of CVD, and thereafter the polycrystalline silicon film 7 and the $SiO_2$ film 51 on the film 7 are patterned to form an opening 52 on an internal base region as shown in FIG. 7C so that the polycrystalline silicon film 7 connects with the semiconductor layer 2 in an external base region. The patterned polycrystalline silicon film 7 serves as a base extending electrode 50.

When the above patterning is performed, not only the opening 52 is formed on the internal base region but an opening 53 for exposing part of the periphery of the $Si_3N_4$ film 6 is formed at one or more places.

Then, by supplying boiled phosphoric acid through the opening 53 around the $Si_3N_4$ film 6, the $Si_3N_4$ film 6 under the polycrystalline silicon film 7 is removed and a space 54 is formed there as shown FIG. 7D. After the space 54 is formed, an internal base layer 55 is formed in the semiconductor layer 2 by introducing P-type impurities from the opening 52 and an external base layer 56 is formed by diffusing P-type impurities into the semiconductor layer 2 from the base extending electrode 50 when annealing the layer 55.

Then, an $SiO_2$ film (not illustrated) is entirely formed under a bad condition that the film is hardly deposited further inside a space and thereafter the $SiO_2$ film is anisotropic-etched approximately vertically by means of RIE. Then, the $SiO_2$ film is left on the inner wall of the opening 52 so that the film serve as an insulating side wall 57 and part of the semiconductor layer 2 is exposed from the opening 52 as shown in FIG. 7E. At the same time, a side wall (not illustrated) is also formed on the side wall of the opening 53 (FIG. 8) at the lateral of the base extending electrode 50 and thereby the periphery of the space 54 formed under the base extending electrode 50 is completely closed.

Thereafter, as shown in FIG. 7F, an emitter electrode 58e made of polycrystalline silicon is formed and an emitter layer 58 is formed at the upper potion of the internal base layer 55 by diffusing N-type impurities contained in the emitter electrode 58e. Then, a base electrode 59, collector electrode 60, and emitter electrode 61 are formed. However, the details are omitted because they are described in the fourth embodiment.

For this embodiment, it is unnecessary to grow a new polycrystalline silicon, anisotropic-etch it, and leave it around the opening 52 because part of the base extending electrode 50 contacts the semiconductor layer 2 at the periphery of the opening 52 when removing the $Si_3N_4$ film 6 by means of phosphoric acid boiling (FIG. 7D).

(Sixth Embodiment)

FIGS. 9A to 9F are sectional views showing the steps for the sixth embodiment.

Figure 9A:
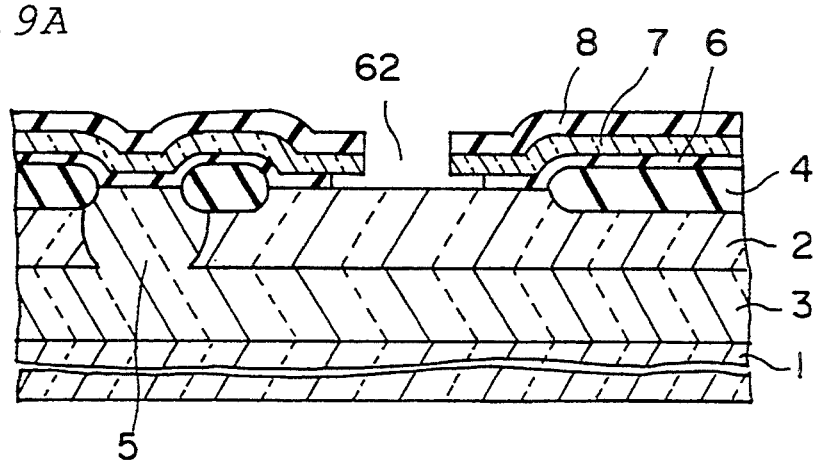
FIGS. 9A to 9F are sectional views showing the steps of fabricating a bipolar transistor which is the sixth embodiment of the present invention.

In FIG. 9A, an $N^+$-type buried layer 3 and $N^-$-type semiconductor layer 2 are formed on a P-type semiconductor substrate 1 and a field oxide film 4 is formed on an N⁻-type semiconductor layer 12 in a active area. Moreover, a collector contact layer 5 enclosed by the field oxide film 4 is formed at a depth reaching the N⁺-type buried layer 3 at one side of the active area. This is the same as the structure of the first embodiment.

Then, an SiO₂ film (not illustrated) with a thickness of several tens of angstroms is formed on the surface of the semiconductor layer 2 by means of thermal oxidation. Thereafter, an Si₃N₄ film 6, a polycrystalline silicon film 7 containing P-type impurities, and an SiO₂ film 8 are formed in order up to the thicknesses of 2,000, 3,000, and 5,000 Å respectively by means of CVD.

Then, a film deposited on the N⁻-type semiconductor layer 2 is patterned by means of lithography to form an opening 62 on an internal base region.

Thereafter, the Si₃N₄ film 6 at the lateral of the opening 62 is laterally etched by means of phosphoric acid boiling and then a thin SiO₂ film (not illustrated) under the film 6 is removed with hydrofluoric acid. The sectional view is shown in FIG. 9A. In this case, the upper SiO₂ film 8 is slightly etched but there is no problem. Thereby, the polycrystalline silicon film 7 protrudes like a hood in the vicinity of the opening 62.

Then, temperature and gas pressure are adjusted under a good condition that a film is easily deposited in a space, a polycrystalline silicon is grown by means of CVD up to a thickness where a polycrystalline silicon film 63 is filled not only on the SiO₂ film 8 and opening 62 but under the hood-like polycrystalline silicon film 7.

Figure 9B:
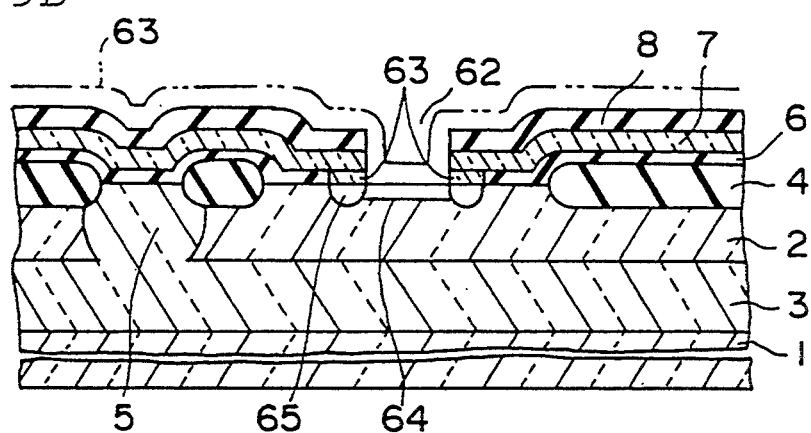

Thereafter, the polycrystalline silicon 63 is left only under the hood-like polycrystalline silicon film 7 by isotropic-etching the polycrystalline silicon 63. Thereby, the polycrystalline silicon film 7 on the Si₃N₄ film 6 connects with the base region of the semiconductor layer 2 as shown in FIG. 9B.

Then, by introducing P-type impurities into the semiconductor layer 2 through the opening 62 and annealing them at, for example, 900° C. for activation, a P-type interval base layer 64 is formed under the opening 62 and a P³⁰-type external base layer 65 is formed under the polycrystalline silicon 63 by diffusing P-type impurities from the polycrystalline silicon film 7.

Figure 9C:
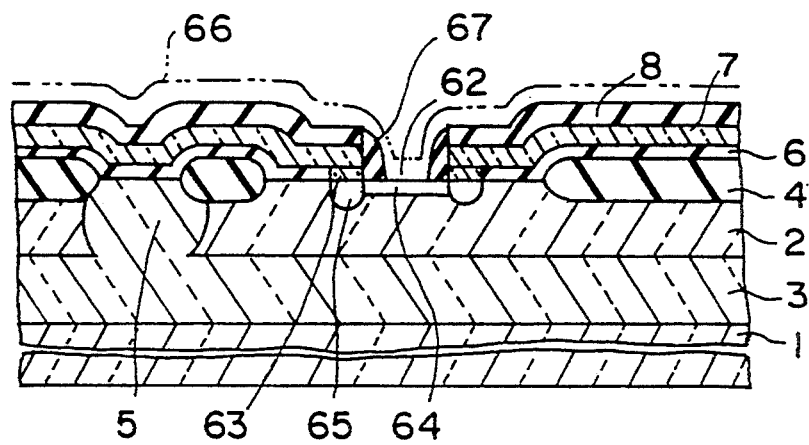

Thereafter, similarly to the first embodiment, an SiO₂ film 66 is entirely deposited and anisotropic-etched approximately vertically by means of RIE. Thus, as shown in FIG. 9C, the SiO₂ film 66 is left on the lateral of the opening 62, a side wall 67 is formed, and part of the internal base layer 64 is exposed from the center of the side wall 67.

Figure 9D:
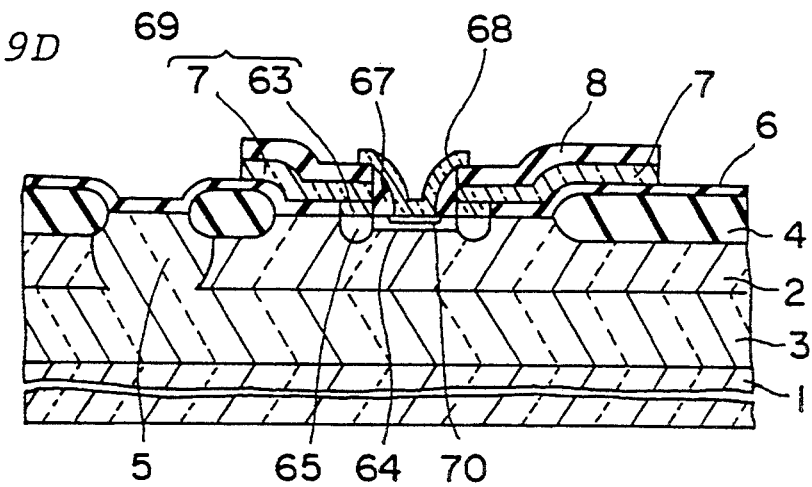

Then, the SiO₂ film 8 and polycrystalline silicon film 7 are patterned and left in a range from a active area to the field oxide film 4 around the region to form the cross section shown in FIG. 9D. Thereby, a base extending electrode 69 is constituted with the patterned polycrystalline silicon film 7 and the polycrystalline silicon 63 under the film 7. An emitter layer 70 is formed on the upper portion of the internal base layer 64 by means of impurity diffusion from the emitter extending electrode 68.

Figure 9E:
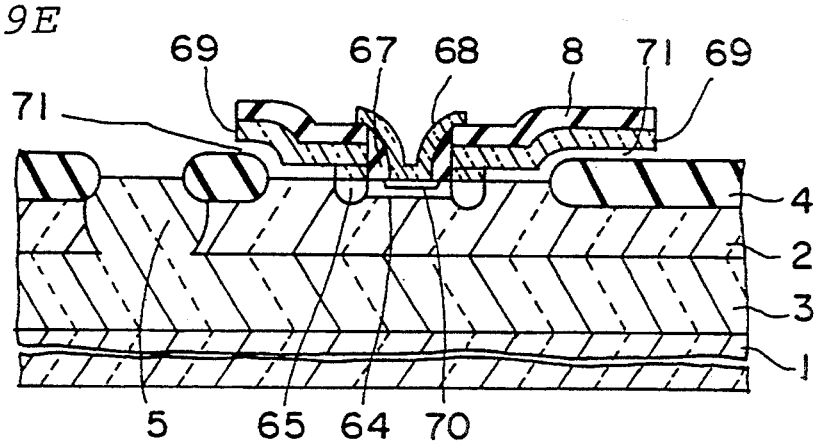

Then, as described in the first embodiment, the Si₃N₄ film 6 is removed by means of phosphoric acid boiling to remove an SiO₂ film (not illustrated) under the film 6 with hydrofluoric acid. Thus, no insulating material is present under the base extending electrode 69 and a space 71 is formed as shown in FIG. 9E.

Figure 9F:
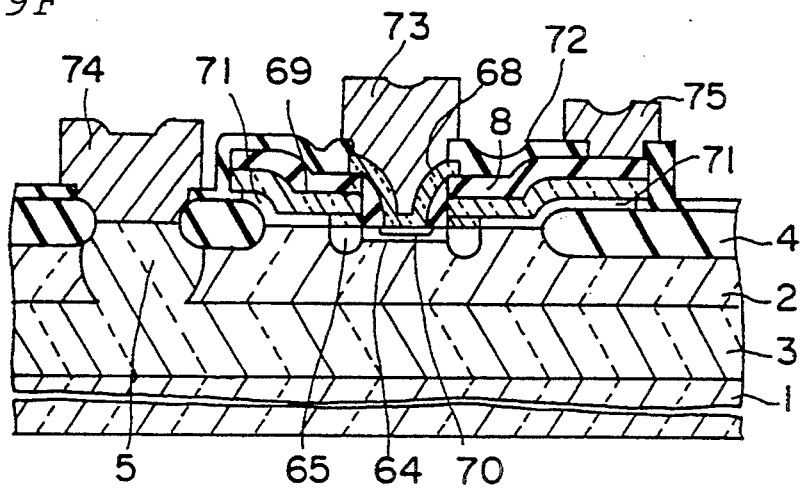

Thereafter, as shown in FIG. 9F, an SiO₂ film 72 is formed under a bad condition that the film is hardly deposited further inside the space by means of CVD and then the SiO₂ film 72 is patterned to form an opening on the base extending electrode 69, emitter extending electrode 68, and collector contact layer 5 respectively and form an emitter electrode 73, collector electrode 74, and base electrode 75 through the openings. The details are omitted because they are the same as the steps shown in FIGS. 3I to 3K for the first embodiment.

Also for this embodiment, the parasitic capacitance between the base and collector decreases because the space 71 is formed between the base extending electrode 69 and semiconductor layer 2.

Moreover, when the space 71 is formed, the base extending electrode 69 is supported by a portion contacting with the external base layer 65 of the base extending electrode 69, and the insulating side wall 67 and emitter extending electrode 68 which are adjacent to the lateral of the portion and the base extending electrode 69 does not tilt in every step. Therefore, it is unnecessary to set an insulating support under the electrode 69.

To form an SiO₂ film for supporting the periphery of the base extending electrode 69, it is possible to use a structure in which a PSG film is used instead of the SiO₂ film 8 on the base extending electrode 69 and the PSG film is patterned like a hood, and then the hood portion is bent so as to contact the field oxide film 4.

(Seventh Embodiment)

For the above embodiment, a method for forming a bipolar transistor is described. However, the method can also be applied to a static induction transistor (SIT). The following is the description of an embodiment of the static induction transistor.

Figure 10:
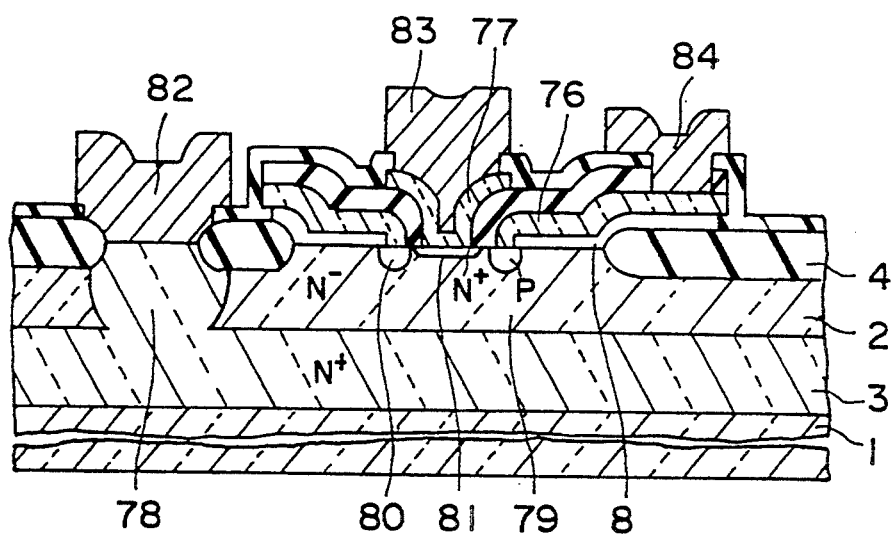
FIG. 10 is a sectional view showing a static induction transistor fabricated in the steps of fabricating the sixth embodiment of the present invention.

FIG. 10 is a sectional view showing an embodiment of SIT and most fabrication steps of it follow those for the above embodiment. A symbol same as that shown in FIGS. 3A to 3K shows the same element. It is a difference that the above base extending electrode functions as a gate extending electrode 76, the emitter extending electrode functions as a source extending electrode 77, the N⁺-type collector contact layer functions as a drain contact layer 78, and the N⁻-type semiconductor layer 2 in the active area functions as a drain layer 79. It is another difference that impurities for forming an internal base layer are not introduced into the N⁻-type semiconductor layer 2, a P-type layer formed due to diffusion of the P-type impurities in the gate extending electrode 76 into the semiconductor layer 2 serves as a gate layer 80, the impurities contained in the source extending electrode 77 are phosphorus, arsenic, and so on, and a layer formed due to diffusion of the impurities into the semiconductor layer 2 serves as an N⁺-type source layer 81.

An electrode connected to the drain contact layer 78 serves as a drain electrode 82, an electrode connected to the source extending electrode 77 serves as a source electrode 83, and an electrode connected to the gate extending electrode 76 serves as a gate electrode 84.

Also for this embodiment, a space 85 is formed under the gate extending electrode 76 in accordance with the method for the above embodiment. Therefore, it is unnecessary to set an insulating material for supporting the gate extending electrode 76 onto the N⁻-type semiconductor layer 2 serving as a drain layer.

The parasitic capacitance between gate and drain decreases to approx. ½ compared with the one of the prior art.

It is also possible to use a drain as a source or a source as a drain. Therefore, the name of each portion described above is also changed.

(Eighth Embodiment)

In the above embodiment, a method for forming a bipolar transistor and a method for forming an SIT similar to the former method are described. For a MOS transistor, however, it is possible to form a space under source and drain extending electrodes.

Figure 11A:
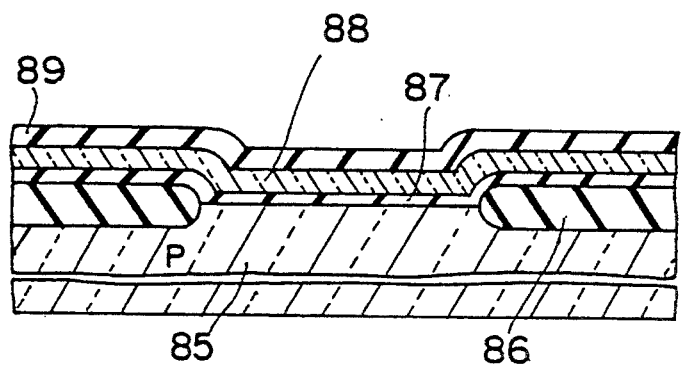
FIGS. 11A to 11G are sectional views showing the steps of fabricating a MOS transistor which is the eighth embodiment of the present invention.

FIGS. 11A to 11G are sectional views showing the steps for the eighth embodiment of the present invention. In FIG. 11A, a field oxide film 86 enclosing a active area is formed on a semiconductor substrate 85 made of P-type silicon by means of LOCOS.

Moreover, on the film 86, an $Si_3N_4$ film 87, a polycrystalline silicon film 88 containing N-type impurities, and an $SiO_2$ film 89 are deposited in order up to the thicknesses of 1,000, 3,000, and 3,000 Å respectively by means of CVD.

Figure 11B:
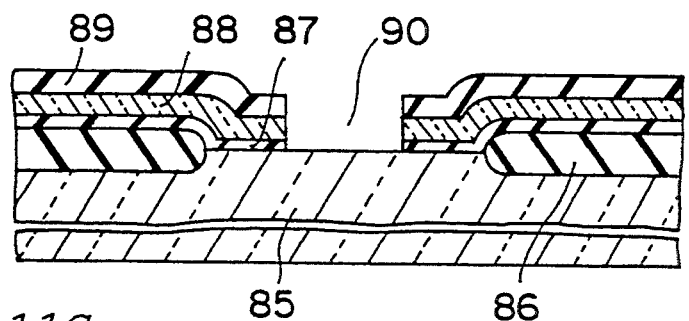

Then, the $Si_3N_4$ film 87, polycrystalline silicon film 88, and $SiO_2$ film 89 are patterned by means of lithography and an opening 90 is formed at the approximately central portion of the active area as shown in FIG. 11B. The opening 90 extends in the direction vertical to the paper surface (not illustrated), which is formed so as to halve the active area enclosed by the field oxide film 86.

Figure 11C:
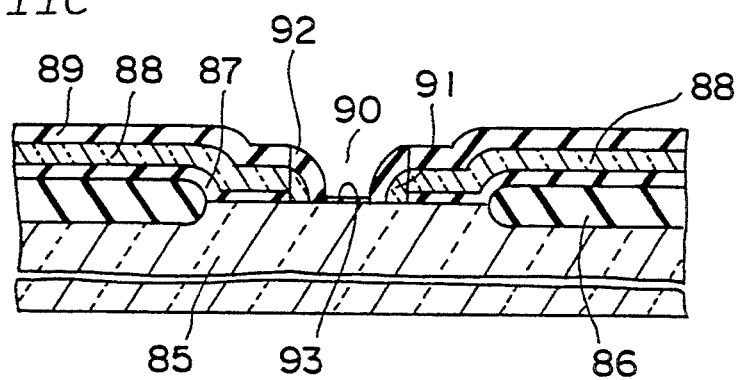

Thereafter, as shown in FIG. 11C, a side wall 91 and an insulating side wall 92 are formed at the lateral of the polycrystalline silicon film 88 around the opening 90 so that they are lower than the top end of the insulating film 89 and they are connected to the semiconductor substrate 85 so that part of the surface of the semiconductor layer 85 is exposed from the center of the layer 85. The details are omitted because they are described in the first embodiment.

Then, the surface of the semiconductor layer 85 exposed from the opening 90 is thermally oxidized to form a gate oxide film 93 with a thickness of several hundreds to several tens of angstroms.

Figure 11D:
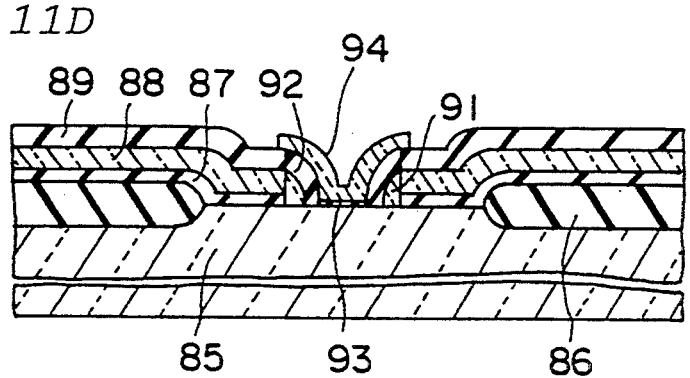

Then, a polycrystalline silicon film containing impurities are grown by means of CVD and thereafter the film is left in the opening 90 to form a gate electrode 94 (FIG. 11D).

Figure 11E:
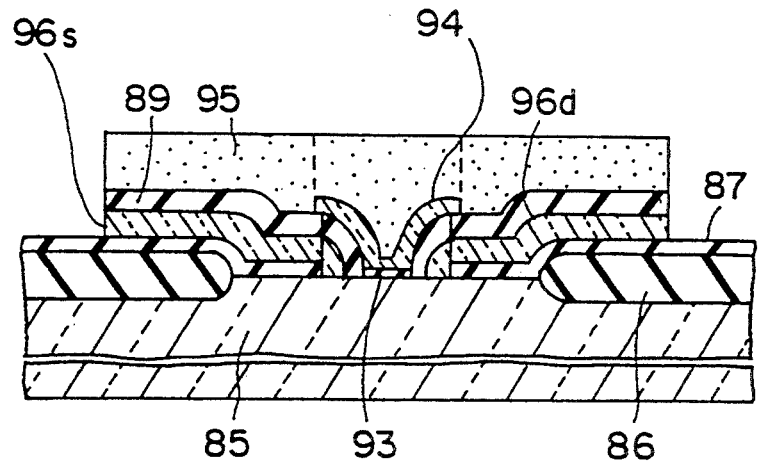

Thereafter, as shown in FIG. 11E, photoresist 95 is applied to the polycrystalline silicon film 88 and then the polycrystalline silicon film 88 is exposed and developed to leave the photoresist 95 in source and drain extending regions and also on the gate electrode 94. The source and drain extending regions are located at the both sides of the opening 90 separately from each other. Then, the $SiO_2$ film 89 and polycrystalline silicon film 88 exposed from the photoresist 95 are etched.

Thus, the polycrystalline silicon film 88 left in the active area and the polycrystalline silicon side wall 91 at the lateral of the film 88 are halved by the gate electrode 94 to serve as a source extending electrode 96s and a drain extending electrode 96d.

Figure 11F:
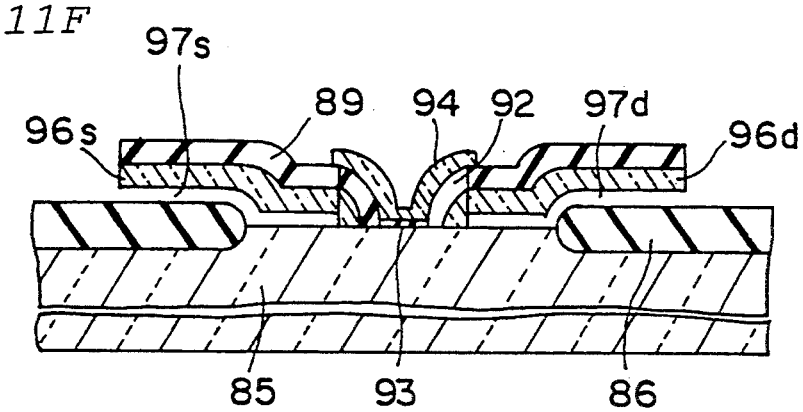

Then, by removing the photoresist 95 and thereafter removing the $Si_3N_4$ film 87 by means of phosphoric acid boiling, the source extending electrode 96s and drain extending electrode 96d are raised from the surface of the semiconductor substrate 85 to form spaces 97s and 97d as shown in FIG. 11F.

Figure 11G:
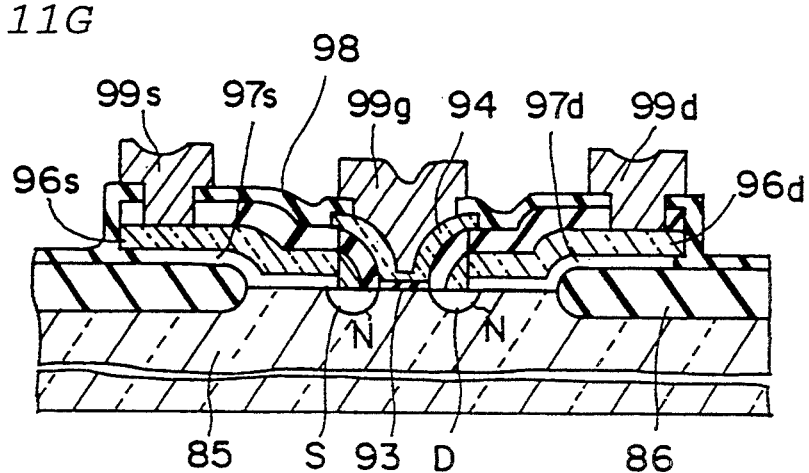

Thereafter, an $SiO_2$ film 98 is entirely formed under a bad condition that the film is hardly deposited further inside a space and then patterned to form an opening on the source extending electrode 96s, drain extending electrode 96d, and gate electrode 94 respectively and form interconnection electrodes 99g, 99s, and 99d connected to them. Thus, a MOSFET shown in FIG. 11G is completed.

Moreover, a source layer S and drain layer D are formed on the semiconductor substrate 85 by means of solid-phase diffusion of N-type impurities contained in the source extending electrode 96s and drain extending electrode 96d.

Also for this embodiment, when a space is formed under the source extending electrode 96s and drain extending electrode 96d, these extending electrodes are kept raised without setting a support under them because the ells are supported by the gate electrode 94 and side wall 92 at their central portion respectively.

A method for forming the spaces 97s and 97d between the source extending electrode 96s, drain extending electrode 96d, and semiconductor substrate 85 is not restricted to the above method. The methods shown in the second to sixth embodiments can also be applied.

(Description of Other Embodiments)

For the above embodiments, to form a space between a base extending electrode of a bipolar transistor, gate extending electrode of an SIT, source and drain extending electrodes of a MOS transistor, and semiconductor layer under them, an $Si_3N_4$ film under the extending electrodes is selectively etched. However, the material is not restricted to the $Si_3N_4$ film.

For example, it is possible to use an $SiO_2$ film as the insulating film under the extending electrodes and an $Si_3N_4$ film as the insulating film for covering the extending electrodes. In this case, hydrofluoric acid is used to selectively etch the $SiO_2$ film.

What is claimed is:

1. A method for fabricating a semiconductor device, comprising the steps of:
   depositing a first insulating film, a first conducting film, and a second insulating film in order on a substratum semiconductor layer containing first-conducting-type impurities;
   patterning the first insulating film, the first conducting film and the second insulating film to form an opening and expose the substratum semiconductor layer from the opening;
   forming a second conducting film for connecting electrically the first conducting film with the substratum semiconductor layer along an inner periphery of the opening;
   forming an insulating side wall for covering the second conducting film in the opening without completely closing the opening;
   forming a first electrode connecting with the substratum semiconductor layer by passing through a center of the opening;
   patterning the first conducting film and the second insulating film and leaving them around the opening to form a second electrode comprising the first and second conducting films and to expose part of the first insulating film; and
   removing the first insulating film selectively by means of isotropic etching to form a space between the second electrode and the semiconductor film.

2. The method for fabricating said semiconductor device according to claim 1, wherein the first and second conducting films are made of semiconductor containing second-conducting-type impurities and the first electrode is made of semiconductor containing first-conducting-type impurities.

3. The method for fabricating said semiconductor device according to claim 2, further comprising the steps of:
introducing said second conducting-type impurities into the surface of the substratum semiconductor layer through the opening to form a first second conducting-type impurity diffusion region after forming the opening;
diffusing the first-conducting-type impurities contained in the first electrode into a surface layer of the second-conducting-type-impurity diffusion layer to form a first-conducting-type-impurity diffusion layer; and diffusing the second-conducting-type impurities contained in the second electrode into a periphery and vicinity of the second-conducting-type-impurity diffusion layer to form a second-conducting-type-impurity diffusion layer.

4. The method for fabricating said semiconductor device according to claim 3, wherein
the substratum semiconductor layer containing the first-conducting-type impurities serves as a collector layer of a bipolar transistor,
the first and second-conducting-type-impurity diffusion layers serve as a base layer of the bipolar transistor, and
the first-conducting-type-impurity diffusion layer serves as an emitter layer of the bipolar transistor.

5. The method for fabricating the semiconductor device according to claim 1, further comprising the steps of:
diffusing the first-conducting-type impurities contained in the first electrode into the surface layer of the substratum semiconductor layer to form a first-conducting-type-impurity diffusion layer with an impurity concentration higher than that of the substratum semiconductor layer; and
diffusing the second-conducting-type impurities contained in the second electrode into the surface of the substratum semiconductor layer.

6. The method for fabricating the semiconductor device according to claim 5, wherein
the substratum semiconductor layer serves as a drain layer of a static induction transistor,
the first-conducting-type-impurity diffusion layer serves as a source layer of the static induction transistor, and
the second-conducting-type-impurity diffusion layer serves as a gate layer of the static induction transistor.

7. The method for fabricating the semiconductor device according to claim 1, further comprising the steps of:
forming an insulating film on a surface of the substratum semiconductor layer exposed from the opening after forming the insulating side wall and before forming the first electrode; and
diffusing the second-conducting-type impurities contained in the second electrode into the surface of the substratum semiconductor layer to form a second-conducting-type-impurity diffusion layer.

8. The method for fabricating the semiconductor device according to claim 7, wherein the second electrode and the second-conducting-type-impurity diffusion layer are halved to both sides of the opening, a first half serves as a source of a MOS transistor and a second half serves as a drain of the MOS transistor, and the first electrode serves as a gate of the MOS transistor.

9. The method for fabricating the semiconductor device according to claim 1, further comprising the steps of:
protruding a outer periphery of the second insulating film onto the second electrode by side-etching an outer periphery of the second electrode after forming the second electrode and before forming the space; and
melting a portion of the second insulating film protruded from the second electrode and bending it downward after forming the space.

10. The method for fabricating the semiconductor device according to claim 1, further comprising the step of:
etching a lateral portion of the first conducting film deposited on the inner surface of the opening after forming the opening and before forming the second electrode.

11. A method for fabricating a semiconductor device, comprising the steps of:
forming a first insulating film and a first conducting film in order on a substratum semiconductor layer containing first-conducting-type impurities;
patterning the first insulating film and the first conducting film to leave them in an active area and around a region;
forming a second insulating film on the substratum semiconductor for covering the first conducting film;
patterning the second insulating film the, first conducting film, and the first insulating film to form an opening;
supplying an etchant through the opening to remove the first insulating film selectively and form a space between the first conducting film and the substratum semiconductor layer; and
forming a semiconductor film for connecting the first conducting film with the substratum semiconductor layer electrically along a periphery of the opening.

12. The method for fabricating the semiconductor device according to claim 11, wherein the first conducting film is made of semiconductor containing second-conducting-type impurities.

13. The method for fabricating the semiconductor device according to claim 11, wherein the semiconductor film is deposited by an epitaxial method and, concurrently, a single-crystalline semiconductor film is deposited on a substratum semiconductor layer in the region exposed from the opening.

14. The method for fabricating the semiconductor device according to claim 13, further comprising the steps of:
covering the semiconductor film around the opening with an insulating side wall; and
forming a second conducting film passing through a region surrounded by the insulating side wall in the opening to connect with the single-crystalline semiconductor film.

15. The method for fabricating the semiconductor device according to claim 14, wherein the second conducting film is made of semiconductor containing the first-conducting-type impurities and a first-conducting-type-impurity diffusion layer is formed by diffusing the first-conducting-type impurities into a surface of the single-crystalline semiconductor layer.

16. The method for fabricating the semiconductor device according to claim 15, wherein
the substratum semiconductor layer constitutes a collector of a bipolar transistor,
the single-crystalline semiconductor film containing second-conducting-type impurities constitutes a base of the bipolar transistor, and
the first-conducting-type-impurity diffusion layer constitutes an emitter of the bipolar transistor.

17. The method for fabricating the semiconductor device according to claim 13, further comprising the step of:
forming an insulating film on the surface of the single-crystalline semiconductor film surrounded by the insulating side wall in the opening before forming a second conducting film.

18. The method for fabricating the semiconductor device according to claim 11, wherein the semiconductor film is formed by the step of leaving the semiconductor film formed in the opening and on the second insulating film only at a lateral portion of the opening by means of anisotropic etching.

19. The method for fabricating the semiconductor device according to claim 11, further comprising the steps of:
forming an insulating side wall covering the semiconductor film around the opening in a region of the opening excluding its central portion; and
forming a second conducting film on the substratum semiconductor layer exposed from the central portion of the opening.

20. The method for fabricating the semiconductor device according to claim 19, further comprising the steps of:
introducing second-conducting-type impurities into a surface of the substratum semiconductor layer at the opening to form a second-conducting-type-impurity diffusion layer; and
diffusing the first-conducting-type impurities contained in the second conducting film into the second-conducting-type-impurity diffusion layer to form a first-conducting-type-impurity diffusion layer.

21. The method for fabricating the semiconductor device according to claim 20, wherein
the substratum semiconductor layer constitutes a collector of a bipolar transistor,
the second-conducting-type-impurity diffusion layer constitutes a base of the bipolar transistor, and
the first-conducting-type-impurity diffusion layer constitutes an emitter of the bipolar transistor.

22. The method for fabricating the semiconductor device according to claim 19, further comprising the step of:
forming an insulating film on a surface of the substratum semiconductor layer exposed from a region enclosed by the insulating side wall in the opening before forming the second conducting film.

23. A method for fabricating a semiconductor device, comprising the steps of:
forming a first insulating film on a substratum semiconductor layer containing first-conducting-type impurities;
forming a first opening in an active area of the first insulating film;
forming a first conducting film on the first insulating film and in the first opening;
patterning the first conducting film and the first insulating film to leave them in said first opening and the active area;
depositing a second insulating film on the first conducting film and the substratum semiconductor layer;
patterning the first conducting film and the second insulating film to form a second opening smaller than the first opening in the first opening and form a third opening for exposing the outer periphery of the first insulating film; and
supplying etchant through the third opening to isotropic-etch the first insulating film and forming a space between an electrode and the substratum semiconductor layer.

24. The method for fabricating the semiconductor device according to claim 23, further comprising the steps of:
forming an insulating side wall along inner peripheries of the second and third openings after forming the space; and
forming a second conducting film serving as a second electrode on the substratum semiconductor layer not covered with the insulating side wall in the second opening.

25. The method for fabricating the semiconductor device according to claim 24, further comprising the steps of:
introducing second-conducting-type impurities into a surface of the substratum semiconductor layer under the second opening to form a first second-conducting-type-impurity diffusion layer;
diffusing the second-conducting-type impurities contained in the first conducting film made of semiconductor material into the substratum semiconductor layer to form a second-conducting-type-impurity diffusion layer connecting with a margin of the first second-conducting-type-impurity diffusion layer; and
diffusing the first-conducting-type impurities contained in the second conducting film made of semiconductor material into the surface of the second-conducting-type-impurity diffusion layer to form a first-conducting-type-impurity diffusion layer.

26. The method for fabricating the semiconductor device according to claim 25, wherein
the substratum semiconductor layer constitutes a collector of a bipolar transistor,
the first and second-conducting-type-impurity diffusion layers constitute a base of the bipolar transistor; and
the first-conducting-type-impurity diffusion layer constitutes an emitter of the bipolar transistor.

27. The method for fabricating the semiconductor device according to claim 22, further comprising the step of:
forming an insulating film on the surface of the semiconductor film exposed in the opening before forming the second conducting film.

* * * * *